United States Patent
Li et al.

(10) Patent No.: US 12,245,466 B2
(45) Date of Patent: Mar. 4, 2025

(54) ARRAY SUBSTRATE, MANUFACTURE METHOD THEREOF, DISPLAY PANEL AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Wei Li, Beijing (CN); Jingjing Xia, Beijing (CN); Bin Zhou, Beijing (CN); Yang Zhang, Beijing (CN); Guangyao Li, Beijing (CN); Wei Song, Beijing (CN); Xuanang Wang, Beijing (CN); Qinghe Wang, Beijing (CN); Liusong Ni, Beijing (CN); Jun Liu, Beijing (CN); Liangchen Yan, Beijing (CN); Ming Wang, Beijing (CN); Jingang Fang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 640 days.

(21) Appl. No.: 17/417,334

(22) PCT Filed: Nov. 5, 2020

(86) PCT No.: PCT/CN2020/126753
§ 371 (c)(1),
(2) Date: Jun. 22, 2021

(87) PCT Pub. No.: WO2021/093666
PCT Pub. Date: May 20, 2021

(65) Prior Publication Data
US 2022/0077255 A1    Mar. 10, 2022

(30) Foreign Application Priority Data
Nov. 15, 2019 (CN) .......................... 201911120801.0

(51) Int. Cl.
*H10K 59/122* (2023.01)
*H10K 50/842* (2023.01)
(Continued)

(52) U.S. Cl.
CPC ....... *H10K 59/122* (2023.02); *H10K 50/8426* (2023.02); *H10K 59/1213* (2023.02); *H10K 71/00* (2023.02); *H10K 59/1201* (2023.02)

(58) Field of Classification Search
CPC ....... H10K 50/00–88; H10K 59/00–95; H10K 65/00; H10K 71/00–861;
(Continued)

(56) References Cited

U.S. PATENT DOCUMENTS

| 5,635,005 A * | 6/1997 | Saitoh .................... D21B 1/322 156/230 |
| 2011/0229730 A1 | 9/2011 | Yosomiya et al. |

(Continued)

FOREIGN PATENT DOCUMENTS

| CN | 104393017 A | 3/2015 |
| CN | 105206646 A | 12/2015 |

(Continued)

OTHER PUBLICATIONS

Mack, C. A. (2006). Semiconductor Lithography (Photolithography)—The Basic Process. Lithoguru. https://www.lithoguru.com/scientist/lithobasics.html (Year: 2006).*

(Continued)

*Primary Examiner* — Evren Seven
*Assistant Examiner* — Cole Leon Lindsey
(74) *Attorney, Agent, or Firm* — Nath, Goldberg & Meyer; Joshua B. Goldberg

(57) ABSTRACT

The present disclosure provides an array substrate, a method for manufacturing the array substrate, a display panel and a display device. The array substrate includes: a substrate; a planarization layer on a side of the substrate; a pixel defining layer configured to define a pixel opening region and located on a side of the planarization layer away from the substrate; an anode in the pixel opening region and on a side of the planarization layer away from the substrate. The array substrate further includes an intermediate insulation layer (Continued)

between the planarization layer and the pixel defining layer. The intermediate insulation layer has a chemical polarity between a chemical polarity of the planarization layer and a chemical polarity of the pixel defining layer.

19 Claims, 1 Drawing Sheet

(51) Int. Cl.
*H10K 59/12* (2023.01)
*H10K 59/121* (2023.01)
*H10K 71/00* (2023.01)

(58) Field of Classification Search
CPC . H10K 85/00–791; H10K 2101/00–90; H10K 2102/00–361; B32B 2457/206
See application file for complete search history.

(56) References Cited

U.S. PATENT DOCUMENTS

| | | | |
|---|---|---|---|
| 2012/0074439 A1 | 3/2012 | Kho et al. | |
| 2016/0111688 A1* | 4/2016 | Lee | H10K 71/00 438/34 |
| 2016/0190511 A1* | 6/2016 | Choi | H10K 59/873 257/40 |
| 2016/0336382 A1* | 11/2016 | Lee | H10K 50/11 |
| 2018/0088419 A1 | 3/2018 | Toyoda | |
| 2019/0011831 A1 | 1/2019 | Li et al. | |

FOREIGN PATENT DOCUMENTS

| | | | |
|---|---|---|---|
| CN | 105742325 A | 7/2016 | |
| CN | 104175670 B | 8/2017 | |
| CN | 108735791 A | 11/2018 | |
| CN | 109103221 A | 12/2018 | |
| CN | 109148533 A | 1/2019 | |
| CN | 109272869 A | 1/2019 | |
| CN | 109461760 A | 3/2019 | |
| CN | 109712930 A | 5/2019 | |
| CN | 110828520 A | 2/2020 | |
| KR | 100658291 B1 * | 11/2005 | H05B 33/22 |
| KR | 100645691 B1 | 11/2006 | |

OTHER PUBLICATIONS

Office Action dated Sep. 2, 2021 issued in corresponding Chinese Application No. 201911120801.0.
Cheng, "Plastic Bonding Technology Manual", Jun. 1992.
Wang, "Principles of Polymer Modification", 2018.
The Second Office Action dated Feb. 23, 2022 corresponding to Chinese application No. 201911120801.0.

* cited by examiner

ARRAY SUBSTRATE, MANUFACTURE METHOD THEREOF, DISPLAY PANEL AND DISPLAY DEVICE

CROSS-REFERENCE TO RELATED APPLICATION

This is a National Phase Application filed under 35 U.S.C. 371 as a national stage of PCT/CN2020/126753 filed on Nov. 5, 2020, an application claiming the benefit from Chinese Patent Application No. 201911120801.0, filed on Nov. 15, 2019, the contents of each of which are incorporated herein by reference in their entirety.

TECHNICAL FIELD

The present disclosure relates to the field of display technologies, and in particular, to an array substrate, a method for manufacturing the array substrate, a display panel and a display device.

BACKGROUND

With the development of display technology, organic electroluminescent display devices (i.e., OLED devices) have been increasingly widely used due to their advantages such as a high brightness, a high resolution, a wide viewing angle, a low power consumption, and a fast response speed.

SUMMARY

As an aspect of the present disclosure, an array substrate is provided. The array substrate includes a substrate; a planarization layer on a side of the substrate; a pixel defining layer configured to define a pixel opening region and on a side of the planarization layer away from the substrate; and an anode in the pixel opening region and on a side of the planarization layer away from the substrate. The array substrate further includes an intermediate insulation layer between the planarization layer and the pixel defining layer. The intermediate insulation layer has a chemical polarity between a chemical polarity of the planarization layer and a chemical polarity of the pixel defining layer.

In an embodiment, the intermediate insulation layer has a chemical polarity less than the chemical polarity of the planarization layer and greater than the chemical polarity of the pixel defining layer.

In an embodiment, the planarization layer includes organic silicon resin, the pixel defining layer includes an organic and fluorine-containing material having a lyophobic property with a solution for forming a light-emitting functional layer, and the intermediate insulation layer includes acrylic resin or polyimide resin.

In an embodiment, the planarization layer includes organic siloxane resin, and the pixel defining layer includes fluorine-containing acrylic resin.

In an embodiment, the intermediate insulation layer has a thickness in a range from 1 μm to 4 μm.

In an embodiment, the pixel defining layer has a plurality of pixel defining regions divided by the pixel opening region. A first pixel defining region and a second pixel defining region among the plurality of pixel defining regions are respectively located at two opposite sides of the pixel opening region along a first direction. In the first pixel defining region, an orthographic projection of the planarization layer on the substrate, an orthographic projection of the intermediate insulation layer on the substrate, and an orthographic projection of the pixel defining layer on the substrate completely overlap each other.

In an embodiment, the intermediate insulation layer in the pixel opening region is on a side of the anode proximal to the planarization layer.

In an embodiment, an orthographic projection of the pixel opening region on the substrate is within the orthographic projection of the intermediate insulation layer on the substrate.

In an embodiment, the substrate includes a base substrate and a pixel driving circuit on the base substrate, the pixel driving circuit including a driving transistor. In the second pixel defining region, a first via hole penetrates through the intermediate insulation layer, the planarization layer, and a portion of the substrate, and the anode is coupled to a drain electrode of the driving transistor via the first via hole. The pixel defining layer is filled in the first via hole and covers a portion of the anode in the first via hole.

In an embodiment, the intermediate insulation layer is absent in the pixel opening region, and the intermediate insulation layer is located on a side of the anode proximal to the pixel defining layer and covers an edge portion of the anode.

In an embodiment, the substrate includes a base substrate and a pixel driving circuit disposed on the base substrate, the pixel driving circuit including a driving transistor. In the second pixel defining region, a second via hole penetrates through the planarization layer and a portion of the substrate, and the anode is coupled to a drain electrode of the driving transistor via the second via hole. The intermediate insulation layer is filled in the second via hole and covers a portion of the anode in the second via hole. The pixel defining layer is located on a side of the intermediate insulation layer in the second via hole away from the substrate.

In an embodiment, the array substrate further includes a light-emitting functional layer, in the pixel opening region and on a side of the anode away from the substrate; and a cathode, on a side of the anode and the pixel defining layer away from the substrate. The pixel defining layer is between the planarization layer and the cathode.

As an aspect of the present disclosure, a display panel is provided. The display panel includes any of above array substrates and a cover plate. An encapsulation adhesive is filled between the array substrate and the cover plate.

As an aspect of the present disclosure, a display device is provided. The display device includes above display panel and a gate driving circuit configured to drive the display panel to display an image.

As an aspect of the present disclosure, a method for manufacturing an array substrate is provided. The method includes: forming a planarization layer on a side of a substrate; forming a pixel defining layer configured to define a pixel opening region on a side of the planarization layer away from the substrate; and forming an anode in the pixel opening region and on a side of the planarization layer away from the substrate. After forming the planarization layer and before forming the pixel defining layer, the method further includes: forming an intermediate insulation layer, wherein the intermediate insulation layer has a chemical polarity between a chemical polarity of the planarization layer and a chemical polarity of the pixel defining layer.

In an embodiment, the intermediate insulation layer is formed before the anode is formed.

In an embodiment, the intermediate insulation layer is formed after the anode is formed.

In an embodiment, forming the intermediate insulation layer includes: coating an intermediate insulation layer film, drying the intermediate insulation layer film, performing exposing and developing processes on the intermediate insulation layer film to form a pattern of the intermediate insulation layer; and drying the pattern of the intermediate insulation layer.

DETAILED DESCRIPTION

Figure 1:
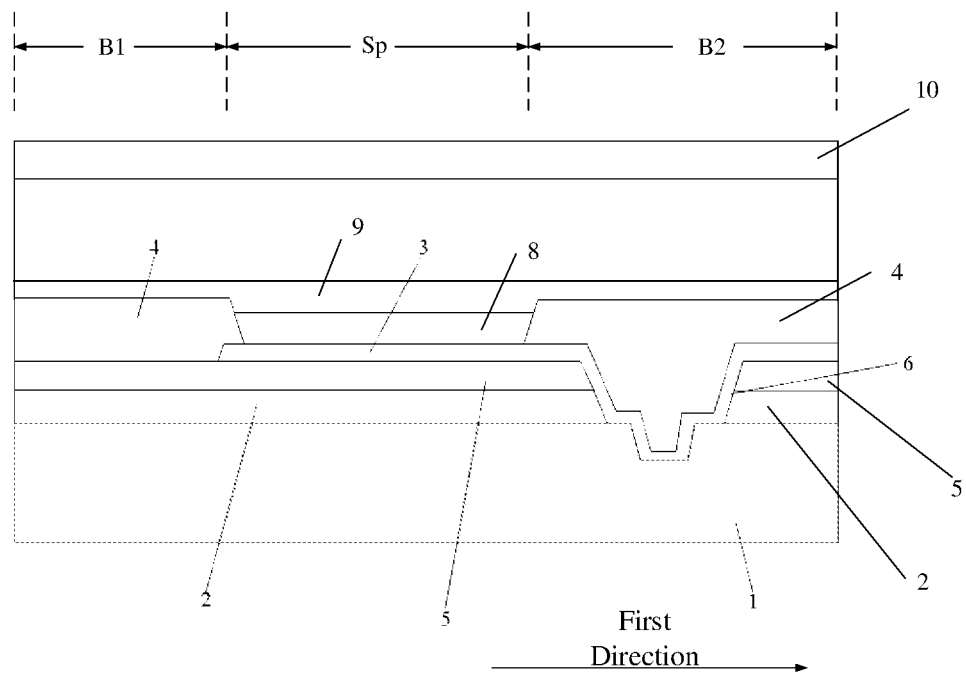
FIG. 1 is a sectional view showing a structure of an array substrate according to an embodiment of the present disclosure.

In order to make those skilled in the art better understand the technical solutions of the present disclosure, an array substrate, a method for manufacturing the array substrate, a display panel and a display device in the present disclosure are further described in detail below with reference to the accompanying drawings and specific embodiments.

The current method for manufacturing the organic electroluminescent layer of the organic electroluminescent diode (OLED) display device includes the following methods. The first method: a light-emitting material is evaporated by using vacuum evaporation technology such as vacuum heating in the presence of a mask, so as to form a film in pixel regions. The vacuum evaporation technology has the advantages such as better uniformity of the film formation and no need of solvent, and has disadvantages such as a low material utilization rate and a high equipment cost, is suitable for only micromolecular luminescent materials, and not suitable for large-size products and the like. The second method: the solution of the luminescent material is dripped into the pixel openings accurately by using the inkjet printing technology of the OLED display device, and a film is formed in the pixel regions by volatilizing the solvent in the solution of the luminescent material. Compared with the vacuum evaporation technology, the inkjet printing technology is suitable for both of the macromolecular luminescent materials and the micromolecular luminescent materials, has advantages such as a high material utilization rate, a low equipment cost, and a high yield, and is beneficial to the large-scale production for large-size products.

However, the difficulty of the inkjet printing technology is forming a light-emitting layer having a uniform thickness in a pixel region. The non-uniform thickness of the light-emitting layer may result in a non-uniform light emission, which seriously affects the display effect. In order to realize a light-emitting layer having a uniform thickness, firstly it has to ensure that a substrate in the pixel region is flat. Generally, a planarization layer made of an acrylic material is adopted in the existing process, however, a flatness of the planarization layer made of the acrylic material cannot meet the requirement of OLED printing. The planarization layer made of an organic siloxane resin having a better leveling property has a better flatness and meets the requirement of OLED printing. However, the organic siloxane resin is formed by heating, dehydrating, and polymerizing organic siloxane containing hydroxyl groups in the periphery, the organic siloxane resin has a high chemical polarity due to a large number of hydroxyl groups in the periphery.

In the OLED display device, a pixel defining layer includes pixel opening regions where a material of the pixel defining layer is not formed and pixel defining regions (i.e., bank regions), in which the material of the pixel defining layer is provided, other than the pixel opening regions. The material of the pixel defining layer is an organic barrier disposed between the pixel opening regions, and generally has a regular trapezoid structure having a narrow top and a wide bottom to limit ink of the inkjet printing from overflowing to the periphery. In order to prevent the inkjet solution from spreading on the tops of the bank regions to pollute the adjacent pixels and cause cross-color over adjacent pixels, the material of the pixel defining layer in the bank regions needs to be lyophobic to the inkjet solution. Therefore, the material of the pixel defining layer in the bank regions has a small chemical polarity.

In the current process for manufacturing the OLED display device, an anode process is performed after a planarization layer process is finished, and then the pixel defining layer is formed by film coating, pre-bake, exposure, development, and post-bake processes, for example. However, since a large difference exists between the chemical polarity of the material of the pixel defining layer and the chemical polarity of the material of the planarization layer, an insufficient adhesion exists between the pixel defining layer and the planarization layer, and thus the pixel defining layer is prone to separate from the planarization layer, thereby resulting in defective pixels and affecting the display quality.

An embodiment of the present disclosure provides an array substrate. As shown in FIG. 1, the array substrate includes a substrate 1, a planarization layer 2 on a side of the substrate 1, an anode 3 located on a side of the planarization layer 2 away from the substrate 1, a pixel defining layer 4 for defining a pixel opening region Sp and located on a side of the planarization layer 2 away from the substrate 1, a light-emitting functional layer 8 located on a side of the anode 3 away from the substrate 1, and a cathode 9 located on a side of the light-emitting functional layer 6 and the pixel defining layer 4 away from the substrate 1. The light-emitting functional layer 8 is disposed in the pixel opening region Sp. The planarization layer 2, the anode 3, the light-emitting functional layer 8 and the cathode 9 are sequentially arranged away from the substrate 1. The pixel defining layer 4 is disposed between the planarization layer 2 and the cathode. The array substrate further includes an intermediate insulation layer 5 between the planarization layer 2 and the pixel defining layer 4. A chemical polarity of the intermediate insulation layer 5 is between a chemical polarity of the planarization layer 2 and a chemical polarity of the pixel defining layer 4. The pixel defining layer has pixel opening regions where the material of the pixel defining layer is not formed and pixel defining regions (i.e., bank regions B1, B2), in which the material of the pixel defining layer is provided, other than the pixel opening regions, as shown in FIG. 1.

The chemical polarity refers to a non-uniform distribution of electrical charge over one covalent bond or one covalent molecule of the material of the film layer. Two substances with similar polarities have better compatibility. The substrate 1 includes a base substrate and a pixel driving circuit (not shown) disposed on the base substrate. The pixel driving circuit includes a driving transistor (not shown). A second bank region B2 is formed with a first via hole 6 therein, with the first via hole 6 penetrating through the intermediate insulation layer 5, the planarization layer 2, and a portion of the substrate 1 to expose a drain electrode of the driving transistor. An anode 3 extends on side walls of the first via hole 6 and is coupled to the drain electrode of the driving transistor via the first via hole 6. The pixel driving circuit is configured to drive the light-emitting functional layer to emit light. The light-emitting functional layer is made of an organic electroluminescent material. Of course, the light-emitting functional layer may be made of other light-emitting materials. The light-emitting functional layer emits light to realize display.

The chemical polarity of the intermediate insulation layer 5 is between the chemical polarity of the planarization layer 2 and the chemical polarity of the pixel defining layer 4, and therefore, the difference between the chemical polarity of the pixel defining layer 4 and the chemical polarity of the intermediate insulation layer 5 and the difference between the chemical polarity of the planarization layer 2 and the chemical polarity of the intermediate insulation layer 5 are respectively significantly smaller than the difference between the chemical polarity of the pixel defining layer 4 and the chemical polarity of the planarization layer 2. As compared with the existing arrangement that the pixel defining layer 4 is in direct contact with the planarization layer 2, the arrangement of the intermediate insulation layer 5 forms a transition between the chemical polarity of the pixel defining layer 4 and the chemical polarity of the planarization layer 2, so that the difference between the chemical polarity of the pixel defining layer 4 and the chemical polarity of the planarization layer 2 is significantly reduced, and thus the pixel defining layer 4 and the planarization layer 2 can be more firmly adhered together through the intermediate insulation layer 5, thereby preventing the pixel defining layer 4 from separating from the planarization layer 2, and improving the quality of the array substrate.

In an embodiment, the chemical polarity of the intermediate insulation layer 5 is smaller than the chemical polarity of the planarization layer 2 and larger than the chemical polarity of the pixel defining layer 4.

In an embodiment, the planarization layer 2 is made of a material such as an organic silicon resin. The pixel defining layer 4 is made of an organic, fluorine-containing material having lyophobic property with a solution for forming the light-emitting functional layer. The intermediate insulation layer 5 is made of a material such as an acrylic resin or a polyimide resin.

Further, the planarization layer 2 is made of a material of an organic siloxane resin, and the pixel defining layer 4 is made of acrylic resin containing fluorine. Since the organic siloxane resin has a good leveling property, the planarization layer 2 made of the organic siloxane resin has a better flatness and can meet the requirement of printing an organic electroluminescent functional layer. However, the organic siloxane resin is formed by heating, dehydrating, and polymerizing organic siloxane containing hydroxyl groups in the periphery, the organic siloxane resin has a high chemical polarity due to a large number of hydroxyl groups in the periphery. Since the fluorine-containing acrylic resin material in the pixel defining layer 4 has a lyophobic property with the inkjet solution for forming the light-emitting functional layer, the inkjet solution can be prevented from spreading on the tops of the bank regions to pollute the adjacent pixels and cause cross-color over adjacent pixels. A material containing the fluorine-containing acrylic resin has a poor chemical polarity, therefore the chemical polarity of the intermediate insulation layer 5 made of acrylic resin or polyimide resin is between the chemical polarity of the pixel defining layer 4 and the chemical polarity of the planarization layer 2, so as to form a transition between the chemical polarity of the pixel defining layer 4 and the chemical polarity of the planarization layer 2, thereby significantly decreasing the difference between the chemical polarity of the pixel defining layer 4 and the chemical polarity of the planarization layer 2, more firmly adhering the pixel defining layer 4 and the planarization layer 2 together through the intermediate insulation layer 5, preventing the pixel defining layer 4 from separating from the planarization layer 2, and improving the quality of the array substrate.

Optionally, the planarization layer 2 contains a single material, for example, an organic siloxane resin.

Optionally, the intermediate insulation layer 5 contains a single material, for example, acryl or polyimide.

The intermediate insulation layer 5 has a thickness in a range from 1 μm to 4 μm.

The pixel defining layer 4 has a plurality of regions (i.e., a plurality of bank regions B1, B2) divided by the pixel opening region Sp. In an embodiment, the first bank region B1 and the second bank region B2 are located on opposite sides of the pixel opening region Sp along a first direction.

In the first bank region B1, the substrate 1, the planarization layer 2, the insulation layer 5, and the pixel defining layer 4 are sequentially stacked along a direction from the substrate 1 to the pixel defining layer 4. In the first bank region B1, an entire orthographic projection of the pixel defining layer 4 on the substrate 1 is within an orthographic projection of the intermediate insulation layer 5 on the substrate 1, and an entire orthographic projection of the pixel defining layer 4 on the substrate 1 is within an orthographic projection of the planarization layer 2 on the substrate 1. In the first bank region B1, the insulation layer 5 is located between the pixel defining layer and the planarization layer 2. The insulation layer 5 spaces the pixel defining layer apart from the planarization layer 2 to avoid direct contact between the pixel defining layer 4 and the planarization layer 2.

In the pixel opening region Sp, the substrate 1, the planarization layer 2, the insulation layer 5, and the anode 3 are sequentially stacked along a direction from the substrate 1 to the anode 3. In the pixel opening region Sp, an entire orthographic projection of the anode 3 on the substrate 1 is within an orthographic projection of the intermediate insulation layer 5 on the substrate 1. In the pixel opening region Sp, an entire orthographic projection of the anode 3 on the substrate 1 is within an orthographic projection of the planarization layer 2 on the substrate 1. In the pixel opening region Sp, the insulation layer 5 is located between the anode 3 and the planarization layer 2, and the insulation layer 5 spaces the anode 3 apart from the planarization layer 2 to avoid direct contact between the anode 3 and the planarization layer 2.

At a boundary between the pixel opening region Sp and the first bank region B1, the pixel defining layer 4 covers a portion of an upper surface of the anode 3 proximal to the pixel defining layer 4, and covers sidewalls of the anode 3.

A first via hole 6 is formed in the second bank region B2 with the first via hole 6 penetrating through the intermediate insulation layer 5, the planarization layer 2 and a portion of the substrate 1 to expose the drain electrode of the driving transistor. The anode 3 extends on the sidewalls and the bottom of the first via hole 6 to be electrically coupled to the drain electrode of the driving transistor. Only the material of the pixel defining layer 4 is filled in the first via hole 6, and the material of the insulation layer 5 and the material of the planarization layer 2 are absent in the first via hole 6. The material of the pixel defining layer 4 fills the first via hole 6, and extends to and covers an upper surface of the anode 3 in the second bank region B2.

In the second bank region B2, an entire orthographic projection of first via hole 6 on substrate 1 is within an orthographic projection of pixel defining layer 4 on substrate 1. In the first via hole 6, the anode 3 covers the sidewalls of the insulation layer 5 and the sidewalls of the planarization layer 2.

In the region of the second bank region B2 except for the first via hole 6, the substrate 1, the planarization layer 2, the insulation layer 5, the anode 3, and the pixel defining layer 4 are sequentially stacked along a direction from the substrate 1 to the pixel defining layer. In the second bank region B2, an orthographic projection of the pixel defining layer 4 on the substrate 1 overlaps an orthographic projection of the intermediate insulation layer 5 on the substrate 1, and the orthographic projection of the pixel defining layer 4 on the substrate 1 overlaps an orthographic projection of the planarization layer 2 on the substrate 1. In the second bank region B2, the insulation layer 5 and the anode 3 are located between the pixel defining layer 4 and the planarization layer 2, thereby spacing the pixel defining layer 4 apart from the planarization layer 2 to avoid direct contact between the pixel defining layer 4 and the planarization layer 2.

In an embodiment, in the bank regions B1 and B2, the intermediate insulation layer 5 is located between the pixel defining layer 4 and the planarization layer 2, and the intermediate insulation layer 5 extends over an entire upper surface of the planarization layer 2 proximal to the pixel defining layer 4 to space the pixel defining layer 4 apart from the planarization layer 2, thereby avoiding direct contact between the pixel defining layer 4 and the planarization layer 2.

In an embodiment, in the pixel opening region, the intermediate insulation layer 5 is located on a side of the anode 3 proximal to the planarization layer 2. That is, the intermediate insulation layer 5 serves as a secondary planarization layer, and thus the intermediate insulation layer 5 may have a secondary planarization function on the basis of the planarization layer 2, so that the flatness of the pixel region can be further improved, and the uniformity of the film formation of the light-emitting functional layer can be further improved.

An orthographic projection of a pixel opening region defined by the pixel defining layer 4 on the substrate 1 is located within an orthographic projection of the intermediate insulation layer 5 on the substrate 1. With this arrangement, an upper surface of the planarization layer 2 may be completely in contact with the intermediate insulation layer 5, and a lower surface of the pixel defining layer 4 except for the portion of the pixel defining layer 4 in contact with the anode 3 may be completely in contact with the intermediate insulation layer 5, thereby further ensuring that the pixel defining layer 4 can be more firmly adhered to the planarization layer 2 through the intermediate insulation layer 5, and preventing the pixel defining layer 4 from separating from the planarization layer 2.

Based on above structure of the array substrate, an embodiment of the present disclosure further provides a method for manufacturing the array substrate, including sequentially forming a planarization layer, an anode, a pixel defining layer, a light-emitting functional layer, and a cathode on the substrate, where the light-emitting functional layer is formed by using an inkjet printing method. After the planarization layer is formed and before the pixel defining layer is formed, the method further includes: forming an intermediate insulation layer, with a chemical polarity of the intermediate insulation layer being between a chemical polarity of the planarization layer and a chemical polarity of the pixel defining layer.

The intermediate insulation layer is formed before the anode is formed.

In an embodiment, the method for manufacturing the array substrate specifically includes steps S101 to S105.

At step S101, a substrate is provided. The substrate includes a base substrate and a pixel driving circuit formed on the base substrate.

At step S102, a planarization layer is formed on a side of the substrate. The planarization layer is made of an organic siloxane resin material and is formed by film coating, pre-baking, exposure, development and post-baking processes.

At step S103, an intermediate insulation layer is formed on a side of the planarization layer away from the substrate. The intermediate insulation layer may be made of acrylic resin or polyimide resin. The manufacture steps specifically include: coating an intermediate insulation layer film; drying the intermediate insulation layer film; performing exposing and developing processes on the intermediate insulation layer film to form a pattern of the intermediate insulation layer; and drying the pattern of the intermediate insulation layer.

At step S104, an anode is formed on a side of the intermediate insulation layer away from the substrate. The anode may be made of ITO (for bottom emission type organic electroluminescent display device) or a laminated material of Al/ITO (for top emission type organic electroluminescent display device). A pattern of the anode is formed by depositing a film layer, exposure, development, wet etching and photoresist stripping processes.

At step S105, a pixel defining layer is formed on a side of the intermediate insulation layer away from the substrate. The pixel defining layer is made of fluorine-containing acrylic resin material. The pixel defining layer is formed through coating, prebaking, exposure, development and post-baking processes.

The specific manufacture processes of various film layers are relatively mature traditional processes, and will not be described herein again.

Figure 2:
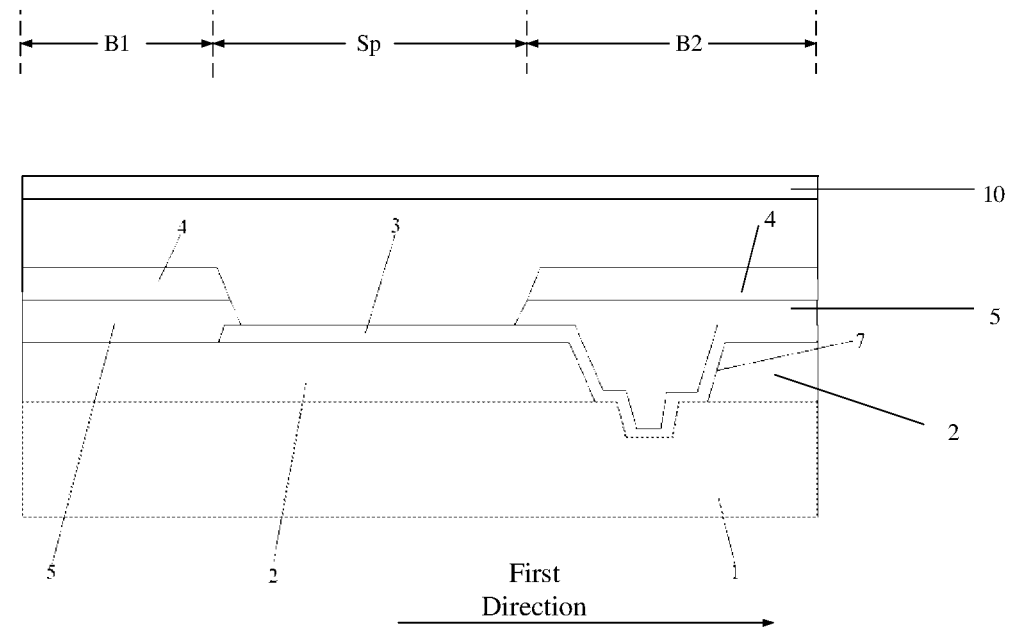
FIG. 2 is a sectional view showing a structure of an array substrate according to an embodiment of the present disclosure.

An embodiment of the present disclosure provides an array substrate, which is different from previous embodiments in that the intermediate insulation layer 5 is located on a side of the anode 3 proximal to the pixel defining layer 4, as shown in FIG. 2.

In the embodiment, the substrate 1 includes a base substrate and a pixel driving circuit (not shown) disposed on the base substrate. The pixel driving circuit includes a driving transistor (not shown). A second via hole 7 is formed in the planarization layer 2, and the anode 3 is coupled to the drain electrode of the driving transistor via the second via hole 7.

The pixel defining layer 4 has a plurality of regions (i.e., a plurality of bank regions B1, B2) divided by the pixel opening region Sp. In an embodiment, the first bank region B1 and the second bank region B2 are located on two opposite sides of the pixel opening region Sp along the first direction.

In the first bank region B1, the substrate 1, the planarization layer 2, the insulation layer 5, and the pixel defining layer 4 are sequentially stacked along a direction from the substrate 1 to the pixel defining layer 4. In the first bank region B1, an orthographic projection of the pixel defining layer 4 on the substrate 1 overlaps an orthographic projection of the intermediate insulation layer 5 on the substrate 1, and the entire orthographic projection of the pixel defining layer 4 on the substrate 1 is within an orthographic projection of the planarization layer 2 on the substrate 1. In the first bank region B1, the insulation layer 5 is located between the pixel defining layer and the planarization layer 2, and the insulation layer 5 spaces the pixel defining layer apart from the planarization layer 2 to avoid direct contact between the pixel defining layer 4 and the planarization layer 2.

In the pixel opening region Sp, the substrate 1, the planarization layer 2, and the anode 3 are sequentially stacked along a direction from the substrate 1 to the anode 3. The intermediate insulation layer 5 is absent in the pixel opening region Sp. In the pixel opening region Sp, an entire orthographic projection of the anode 3 on the substrate 1 is within an orthographic projection of the planarization layer 2 on the substrate 1. Only the planarization layer 2 and the anode 3 are in the pixel opening region Sp, and the intermediate insulation layer 5 is absent in the pixel opening region Sp.

At a boundary between the pixel opening region Sp and the first bank region B1, the intermediate insulation layer 5 covers a portion of the upper surface of the anode 3 proximal to the pixel defining layer 4 and covers one sidewall of the anode 3.

The second via hole 7 in the second bank region B2 penetrates through the planarization layer 2 and a portion of the substrate 1 to expose the drain electrode of the driving transistor. The anode 3 extends on both sidewalls and the bottom of the first via hole 6 to be electrically coupled to the drain electrode of the driving transistor. The material of the pixel defining layer 4 and the material of the intermediate insulation layer 5 are filled in the first via hole 6, and the material of the planarization layer 2 is absent in the first via hole 6. The material of the intermediate insulation layer 5 is filled in the second via hole 7, covers a portion of the anode 3 in the second via hole 7, and extends to and covers an upper surface of the anode 3 in the second bank region B2. In the second bank region B2, the pixel defining layer 4 is located on a side of the intermediate insulation layer 5 away from the substrate 1.

In the second bank region B2, an entire orthographic projection of the second via hole 7 on the substrate 1 is within an orthographic projection of the pixel defining layer 4 on the substrate 1, and within an orthographic projection of the intermediate insulation layer 5 on the substrate 1. In the second via hole 7, the anode 3 covers only the sidewalls of the planarization layer 2.

In the region of the second bank region B2 except for the second via hole 7, the substrate 1, the planarization layer 2, the anode 3, the intermediate insulation layer 5, and the pixel defining layer 4 are sequentially stacked along a direction from the substrate 1 to the pixel defining layer 4. In the second bank region B2, an orthographic projection of the pixel defining layer 4 on the substrate 1 overlaps an orthographic projection of the intermediate insulation layer 5 on the substrate 1, and the orthographic projection of the pixel defining layer 4 on the substrate 1 overlaps an orthographic projection of the planarization layer 2 on the substrate 1. In the second bank region B2, the insulation layer 5 and the anode 3 are located between the pixel defining layer 4 and the planarization layer 2, thereby spacing the pixel defining layer 4 apart from the planarization layer 2 to avoid direct contact between the pixel defining layer 4 and the planarization layer 2.

In the embodiment, the intermediate insulation layer 5 between the pixel defining layer 4 and the planarization layer 2 is disposed in the bank regions B1 and B2 to space the pixel defining layer 4 apart from the planarization layer 2, thereby avoiding direct contact between the pixel defining layer 4 and the planarization layer 2. The intermediate insulation layer 5 is absent in the pixel opening region Sp.

In the embodiment, the intermediate insulation layer 5 in bank regions B1 and B2 serves as a lower pixel defining layer, which is more advantageous to spreading of a solution of an organic light-emitting functional layer for inkjet printing because the lower pixel defining layer has a chemical polarity greater than that of the upper pixel defining layer 4, thereby forming a light-emitting functional layer having a uniform thickness.

In an embodiment, the substrate 1 includes a base substrate and a pixel driving circuit (not shown) disposed on the base substrate. The pixel driving circuit includes a driving transistor (not shown). A second via hole 7 is formed in the planarization layer 2, and the anode 3 is coupled to the drain electrode of the driving transistor through the second via hole 7. The intermediate insulation layer 5 is filled in the second via hole 7 and covers a portion of the anode 3 in the second via hole 7. The pixel defining layer 4 is located on a side of the intermediate insulation layer 5 in the second via hole 7 away from the substrate 1. In an embodiment, the intermediate insulation layer 5 covers an edge portion of the anode 3. In the embodiment, only a lower surface of the pixel defining layer 4 is in contact with the intermediate insulation layer 5, and an upper surface of the planarization layer 2 except for the portion of the planarization layer 2 in contact with the anode 3 is completely in contact with the intermediate insulation layer 5, so as to further ensure that the pixel defining layer 4 can be more firmly adhered to the planarization layer 2 through the intermediate insulation layer 5, and prevent the pixel defining layer 4 from separating from the planarization layer 2.

Based on the above structure of the array substrate, an embodiment of the present disclosure also provides a method for manufacturing the array substrate, which is different from the method in the foregoing embodiments in that the intermediate insulation layer is formed after the anode is formed.

In the embodiment, the method for manufacturing the array substrate includes steps S201 to S205.

At step S201, a substrate is provided. The substrate includes a base substrate and a pixel driving circuit formed on the base substrate.

At step S202, a planarization layer is formed on a side of the substrate. The planarization layer is made of an organic siloxane resin material and is formed by film coating, pre-baking, exposure, development and post-baking processes.

At step S203, an anode is formed on a side of the planarization layer away from the substrate. The anode may be made of ITO (for bottom emission type organic electroluminescent display device) or a laminated material of Al/ITO (for top emission type organic electroluminescent display device). A pattern of the anode is formed by depositing a film layer, exposure, development, wet-etching and photoresist stripping processes.

At step S204, an intermediate insulation layer covering the side walls of the anode is formed on a side of the planarization layer away from the substrate. The intermediate insulation layer may be made of acryl resin or polyimide resin, and the formation of the intermediate insulation layer includes: coating an intermediate insulation layer film; drying the intermediate insulation layer film; performing exposing and developing processes on the intermediate insulation layer film to form a pattern of the intermediate insulation layer; and drying the pattern of the intermediate insulation layer.

At step S205, a pixel defining layer is formed on a side of the insulation layer away from the substrate. The pixel defining layer is made of a fluorine-containing acrylic resin material. The pixel defining layer is formed by coating a film layer, pre-baking, exposing, developing and post-baking processes.

The specific manufacture processes of the above films are all mature traditional processes, and will not described herein again.

The present disclosure provides the following benefits: in the array substrate of the present disclosure, since the chemical polarity of the intermediate insulation layer is between the chemical polarity of the planarization layer and the chemical polarity of the pixel defining layer, the difference between the chemical polarity of the pixel defining layer and the chemical polarity of the intermediate insulation layer and the difference between the chemical polarity of the planarization layer and the chemical polarity of the intermediate insulation layer are much smaller than the difference between the chemical polarity of the pixel defining layer and the chemical polarity of the planarization layer. As compared with the existing arrangement that the pixel defining layer is in direct contact with the planarization layer, the arrangement of the intermediate insulation layer 5 according to the present disclosure forms a transition between the chemical polarity of the pixel defining layer 4 and the chemical polarity of the planarization layer 2, so that the difference between the chemical polarity of the pixel defining layer 4 and the chemical polarity of the planarization layer 2 is significantly reduced, and thus the pixel defining layer 4 and the planarization layer 2 can be more firmly adhered together through the intermediate insulation layer 5, thereby preventing the pixel defining layer 4 from separating from the planarization layer 2, and improving the quality of the array substrate.

An embodiment of the present disclosure provides a display panel, which includes the array substrate in the foregoing embodiments and a cover plate 10 which is a glass substrate or a metal thin plate having the same size as the array substrate. An encapsulation adhesive is filled between the array substrate and the cover plate 10.

With the array substrate in the foregoing embodiments, the pixel defining layer in the array substrate can be prevented from falling off, thereby improving the quality of the display panel.

An embodiment of the present disclosure provides a display device including the display panel in the foregoing embodiments and a gate driving circuit configured to drive the display panel to display an image.

With the display panel in the foregoing embodiments, the pixel defining layer in the display panel can be prevented from falling off, thereby improving the quality of the display device.

The display device provided by the present disclosure may be any product or component with a display function, such as an OLED panel, an OLED television, a display, a mobile phone, a navigator and the like.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as the scope of the present disclosure.

What is claimed is:

1. An array substrate, comprising:
a substrate;
a planarization layer on a side of the substrate;
a pixel defining layer configured to define a pixel opening region and on a side of the planarization layer away from the substrate; and
an anode in the pixel opening region and on a side of the planarization layer away from the substrate; wherein
the array substrate further comprises an intermediate insulation layer between the planarization layer and the pixel defining layer, and
the intermediate insulation layer has a chemical polarity between a chemical polarity of the planarization layer and a chemical polarity of the pixel defining layer,
the pixel defining layer has a first pixel defining region and a second pixel defining region, and a pixel opening region between the first pixel defining region and the second pixel defining region,
in the second pixel defining region, a step-shaped via hole penetrates through at least two of the intermediate insulation layer, the planarization layer, and the substrate, with the step-shaped via hole comprising a first sub-via hole in the substrate and a second sub-via hole on side of the first sub-via hole away from the substrate, an orthographic projection of the first sub-via hole on the substrate is inside an orthographic projection of the second sub-via hole on the substrate,
the anode in the second pixel defining region has a stepped shape and comprises a first anode portion on a sidewall and a bottom of the first sub-via hole, a second anode portion on a sidewall of the second sub-via hole, and a third anode portion connecting the first anode portion and the second anode portion and extending on a surface of the substrate close to the planarization layer.

2. The array substrate of claim 1, wherein
the intermediate insulation layer has a chemical polarity less than the chemical polarity of the planarization layer and greater than the chemical polarity of the pixel defining layer.

3. The array substrate of claim 1, wherein
the intermediate insulation layer has a thickness in a range from 1 μm to 4 μm.

4. The array substrate of claim 1, wherein
in the first pixel defining region, an orthographic projection of the planarization layer on the substrate, an orthographic projection of the intermediate insulation layer on the substrate, and an orthographic projection of the pixel defining layer on the substrate completely overlap each other.

5. The array substrate of claim 4, wherein
the intermediate insulation layer in the pixel opening region is on a side of the anode proximal to the planarization layer.

6. The array substrate of claim 4, wherein
an orthographic projection of the pixel opening region on the substrate is within the orthographic projection of the intermediate insulation layer on the substrate.

7. The array substrate of claim 4, wherein
the substrate comprises a base substrate and a pixel driving circuit on the base substrate, the pixel driving circuit comprising a driving transistor,
in the second pixel defining region, the via hole penetrates through the intermediate insulation layer, the planarization layer, and a portion of the substrate, the anode is coupled to a drain electrode of the driving transistor via the via hole, and the pixel defining layer is filled in the via hole and covers a portion of the anode in the via hole.

8. The array substrate of claim 4, wherein
the intermediate insulation layer is absent in the pixel opening region, and
the intermediate insulation layer is located on a side of the anode proximal to the pixel defining layer.

9. The array substrate of claim 8, wherein
the intermediate insulation layer covers an edge portion of the anode.

10. The array substrate of claim 4, wherein
the substrate comprises a base substrate and a pixel driving circuit disposed on the base substrate, the pixel driving circuit comprising a driving transistor,
in the second pixel defining region, the via hole penetrates through the planarization layer and a portion of the substrate,
the anode is coupled to a drain electrode of the driving transistor via the via hole,
the intermediate insulation layer is filled in the via hole and covers a portion of the anode in the via hole, and
the pixel defining layer is located on a side of the intermediate insulation layer in the via hole away from the substrate.

11. The array substrate of claim 1, further comprising:
a light-emitting functional layer in the pixel opening region and on a side of the anode away from the substrate; and
a cathode on a side of the anode and the pixel defining layer away from the substrate, wherein
the pixel defining layer is between the planarization layer and the cathode.

12. A display panel, comprising:
an array substrate of claim 1; and
a cover plate, wherein
an encapsulation adhesive is filled between the array substrate and the cover plate.

13. A display device, comprising:
the display panel of claim 12; and
a gate driving circuit configured to drive the display panel to display an image.

14. A method for manufacturing an array substrate, comprising:
forming a planarization layer on a side of a substrate;
forming a pixel defining layer configured to define a pixel opening region on a side of the planarization layer away from the substrate such that the pixel defining layer has a first pixel defining region and a second pixel defining region, and a pixel opening region between the first pixel defining region and the second pixel defining region; and
after forming the planarization layer and before forming the pixel defining layer, the method further comprises:

forming a step-shaped via hole in the second pixel defining region, such that the step-shaped via hole penetrates through at least two of the intermediate insulation layer, the planarization layer, and the substrate, the step-shaped via hole comprises a first sub-via hole in the substrate and a second sub-via hole on side of the first sub-via hole away from the substrate, an orthographic projection of the first sub-via hole on the substrate is inside an orthographic projection of the second sub-via hole on the substrate,
forming an anode in the pixel opening region and the second pixel defining region, such that the anode in the second pixel defining region has a stepped shape and comprises a first anode portion on a sidewall and a bottom of the first sub-via hole, a second anode portion on a sidewall of the second sub-via hole, and a third anode portion connecting the first anode portion and the second anode portion and extending on a surface of the substrate close to the planarization layer,
forming an intermediate insulation layer such that the intermediate insulation layer in the first pixel defining region is directly contact with the planarization layer and the pixel defining layer, respectively, and
the intermediate insulation layer has a chemical polarity between a chemical polarity of the planarization layer and a chemical polarity of the pixel defining layer.

15. The method of claim 14, wherein
the intermediate insulation layer is formed before the anode is formed.

16. The method of claim 14, wherein
the intermediate insulation layer is formed after the anode is formed.

17. The method of claim 14, wherein
forming the intermediate insulation layer comprises:
coating an intermediate insulation layer film,
drying the intermediate insulation layer film,
performing exposing and developing processes on the intermediate insulation layer film to form a pattern of the intermediate insulation layer; and
drying the pattern of the intermediate insulation layer.

18. The array substrate of claim 2, wherein
the planarization layer comprises organic silicon resin,
the pixel defining layer comprises an organic and fluorine-containing material having a lyophobic property with a solution for forming a light-emitting functional layer, and
the intermediate insulation layer comprises acrylic resin or polyimide resin.

19. The array substrate of claim 18, wherein
the planarization layer comprises organic siloxane resin, and
the pixel defining layer comprises fluorine-containing acrylic resin.

* * * * *